United States Patent
Ohsato

(10) Patent No.: US 7,362,522 B2
(45) Date of Patent: Apr. 22, 2008

(54) LENS BARREL

(75) Inventor: Masayoshi Ohsato, Hachioji (JP)

(73) Assignee: Konica Minolta Opto, Inc., Tokyo (JP)

( * ) Notice: Subject to any disclaimer, the term of this patent is extended or adjusted under 35 U.S.C. 154(b) by 0 days.

(21) Appl. No.: 11/435,475

(22) Filed: May 17, 2006

(65) Prior Publication Data

US 2006/0262431 A1 Nov. 23, 2006

(30) Foreign Application Priority Data

May 23, 2005 (JP) ............................. 2005-149369

(51) Int. Cl.
*G02B 7/02* (2006.01)
(52) U.S. Cl. ...................... 359/824; 359/822; 359/823; 359/811; 359/819
(58) Field of Classification Search ................ 359/819, 359/811, 813, 822, 823, 824, 826, 814, 821
See application file for complete search history.

(56) References Cited

U.S. PATENT DOCUMENTS 5,939,804 A * 8/1999 Nakao et al. ................. 310/12

2004/0178699 A1 * 9/2004 Nakanishi ............... 310/323.01

FOREIGN PATENT DOCUMENTS

JP 08-179184 7/1996
JP 08-179184 * 12/1996

* cited by examiner

*Primary Examiner*—Ricky Mack
*Assistant Examiner*—Brandi N Thomas
(74) *Attorney, Agent, or Firm*—Cohen Pontani Lieberman & Pavane LLP

(57) ABSTRACT

A lens barrel, including plural lens units for zooming and focusing a subject, an actuating section for moving at least one of the plural lens units, and a housing section for house the plural lens units and the actuating section, wherein the actuating section includes, a vibrating member including plural piezoelectric elements assembled to cross each other at a predetermined angle, and the vibrating member vibrates based on applied high frequency electrical signals, a rail member assembled facing the vibrating member, and a rotatable supporting member for sandwiching the rail member with the vibrating member, and wherein the rail member is assembled on the housing section, while the vibrating member and the rotatable supporting member are assembled on the lens unit which moves for zooming and focusing the subject.

6 Claims, 6 Drawing Sheets

FIG. 3 (a) 60°
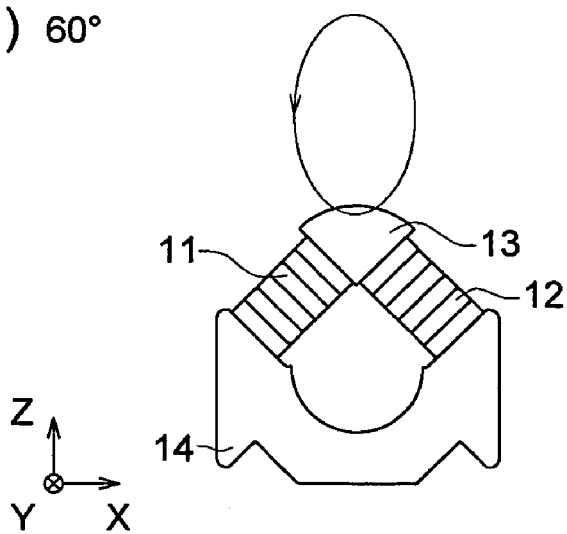
FIG. 3 (b) 90°
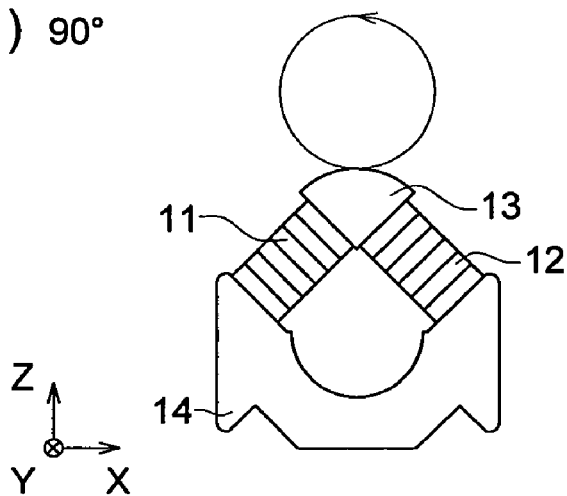
FIG. 3 (c) 120°
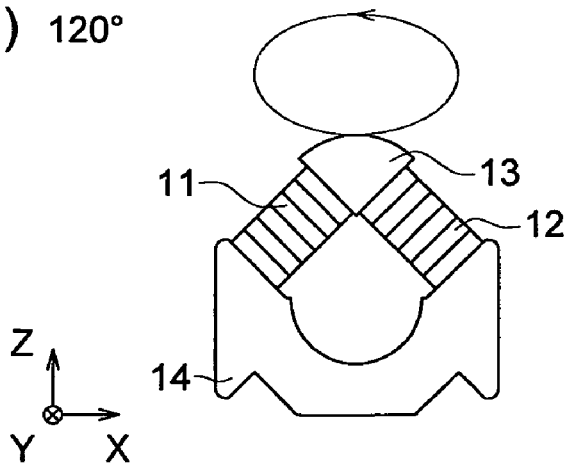

LENS BARREL

This application is based on Japanese Patent Application No. 2005-149369 filed on May 23, 2005, with the Japanese Patent Office, the entire content of which is hereby incorporated by reference.

TECHNICAL FIELD

The present invention relates to a lens barrel for an image pickup device, in which magnification lens units and focusing lens units in the lens barrel are shifted by vibration generated by a vibration unit.

BACKGROUND

A driving device is well known in which the alternating current voltage is applied to a piezoelectric element so that a vibrating section is oscillated, and the vibrating section is repeatedly brought into contact with or separated from members to be shifted, whereby the members can be shifted by friction force. A lens barrel is also well known in which above driving device is used for shifting the lens units.

As a driving device, which uses the piezoelectric element to shift lens units along the optical axis, a lens driving device is disclosed in which a vibrator to create driving vibration along the optical axis is pressed by an elastic member against a guide shaft, which is a stationary part prolonging along the optical axis, and the vibrator is assembled in a lens supporting member (see Patent Document 1)

[Patent Document 1] Unexamined Japanese Patent Application Publication 8-179184

However, the lens driving device of Patent Document 1 features the vibrator in the lens supporting member, and the vibrator is pressed against a guide shaft, which guides the lens supporting member along the optical axis, via the elastic member. Accordingly, due to the reaction force of pressing force caused by the elastic member, the guide shaft is off-center in the hole of the lens supporting member. Consequently, friction increases between the hole of the lens supporting member and the engaging guide shaft, and off-center abrasion is created in the hole of the lens supporting member, which results in unstable movement, and further, the position of the lens units is shifted in the direction perpendicular to the optical axis by the off-center abrasion of the hole, resulting in deterioration of the desired lens characteristics.

Further, since the movement of the lens units by the vibrator is conducted due to the friction force, the friction force between the hole of the lens supporting member and the engaging guide shaft works in the direction to reduce the driving force of the vibrator, which results in the reduction of the driving efficiency of the vibrator, and further the change of the friction force between the hole and the guide shaft triggers unstable movement.

This problem happens by the reaction force of the elastic member, even when the stationary part is separated from the guide shaft, as a separated structure.

SUMMARY OF THE INVENTION

With a view to the above problems, an object of the present invention is to obtain a lens barrel using a vibration actuator having high driving efficiency, stable operation, and high durability.

The above problem can be overcome via the structures detailed below.

Structure 1

In a lens barrel, including lens units for focusing light from the subject, an actuator for driving at least one of the lens units, and a housing section, the lens barrel is characterized in that the actuator is a vibration actuator, including a vibrator section in which plural piezoelectric elements cross each other in a predetermined angle, and a vibrator section which vibrates based on high frequency signals, a rail member arranged facing the vibrator, and a rotatable supporting member arranged at a position facing the vibrator, and which sandwiches the rail member with the vibrator, wherein the rail member is assembled in the housing section, and the vibrator and the supporting member are assembled in the driven lens units.

Structure 2

In the lens barrel in Structure 1, the lens units including the vibrator and the supporting member have plural guide members along the driving direction, and one of the guide members is the rail member.

Structure 3

In the lens barrel in Structure 1 or 2, the lens barrel includes a position detecting sensor for detecting the position of the driven lens units, and a sensor section of the position detecting sensor is assembled in the driven lens units, and a sensor scale is assembled in the housing section.

Structure 4

In the lens barrel in Structures 1 to 3, the lens units structure an optical zooming system to move the plural lens units, and the sensor scale of the position detecting sensor to detect the plural driven lens units is commonly used for each lens unit.

Structure 5

In the lens barrel in Structures 1 to 4, the vibration actuator is assembled in the housing section.

Based on the present invention, the reaction force of the pressing force against the driven member while the vibration member is energized, is prevented from exerting a force against a lens frame and the guide shaft. Due to this, the change of the friction force produced between the lens frame and the guide shaft is reduced, and thereby the lens barrel having high driving efficiency and high durability with stable operation, can be attained.

BRIEF DESCRIPTION OF THE DRAWINGS

Embodiment will now be described, by way of example only, with reference to the accompanying drawings which are meant to be exemplary, not limiting, and wherein like elements are numbered alike in several Figures, in which:

FIGS. 3(a), (b) and (c) show the driving operation of the vibrating section;

DESCRIPTION OF THE PREFERRED EMBODIMENTS

This invention is explained referring to the embodiments below, however it is not limited to these embodiments.

Firstly, the vibration actuator used in the lens barrel of the embodiment will be detailed.

Figure 1:
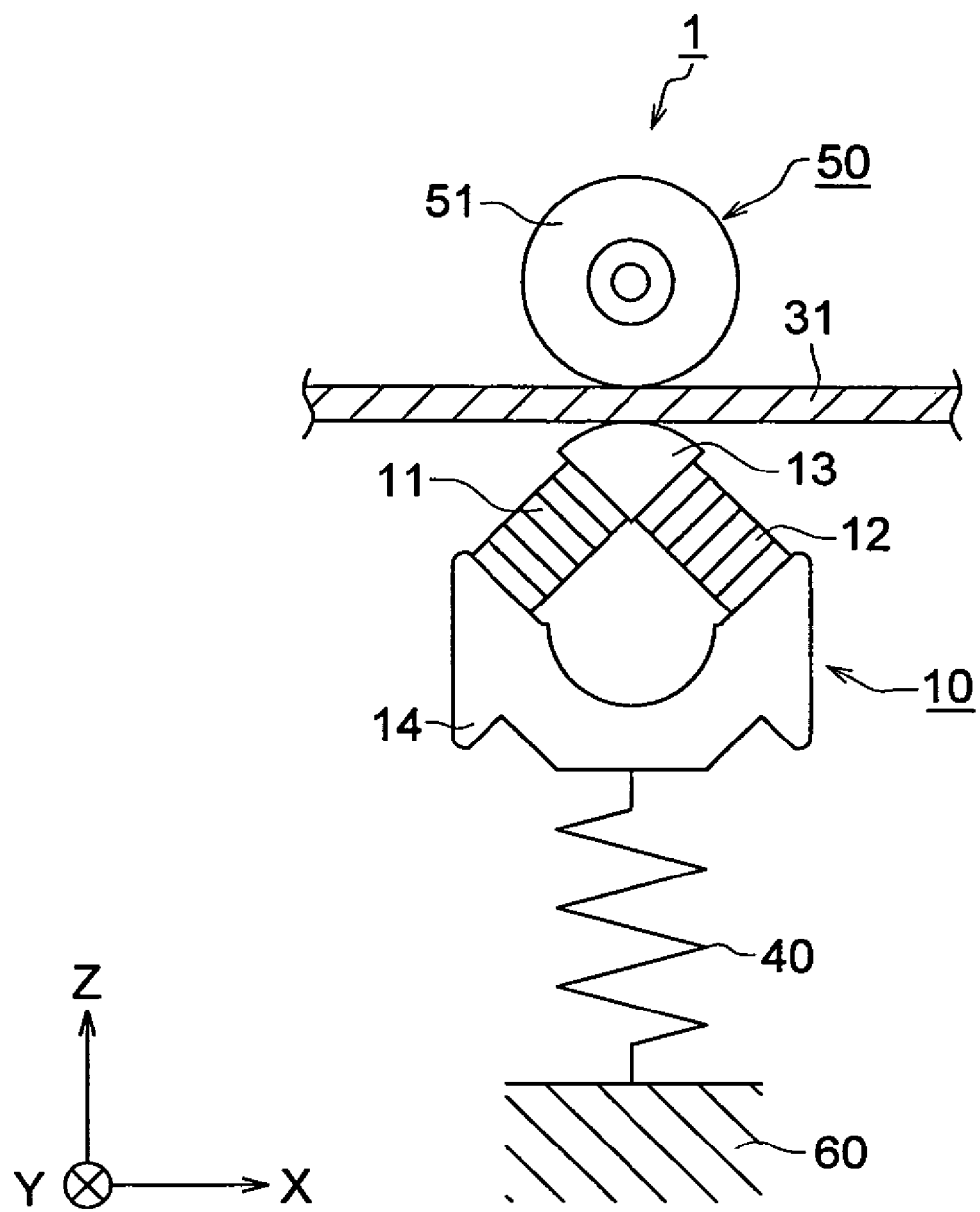
FIG. 1 is a front elevation view of the vibration actuator used in the lens barrel relating to the present embodiment.
Figure 2:
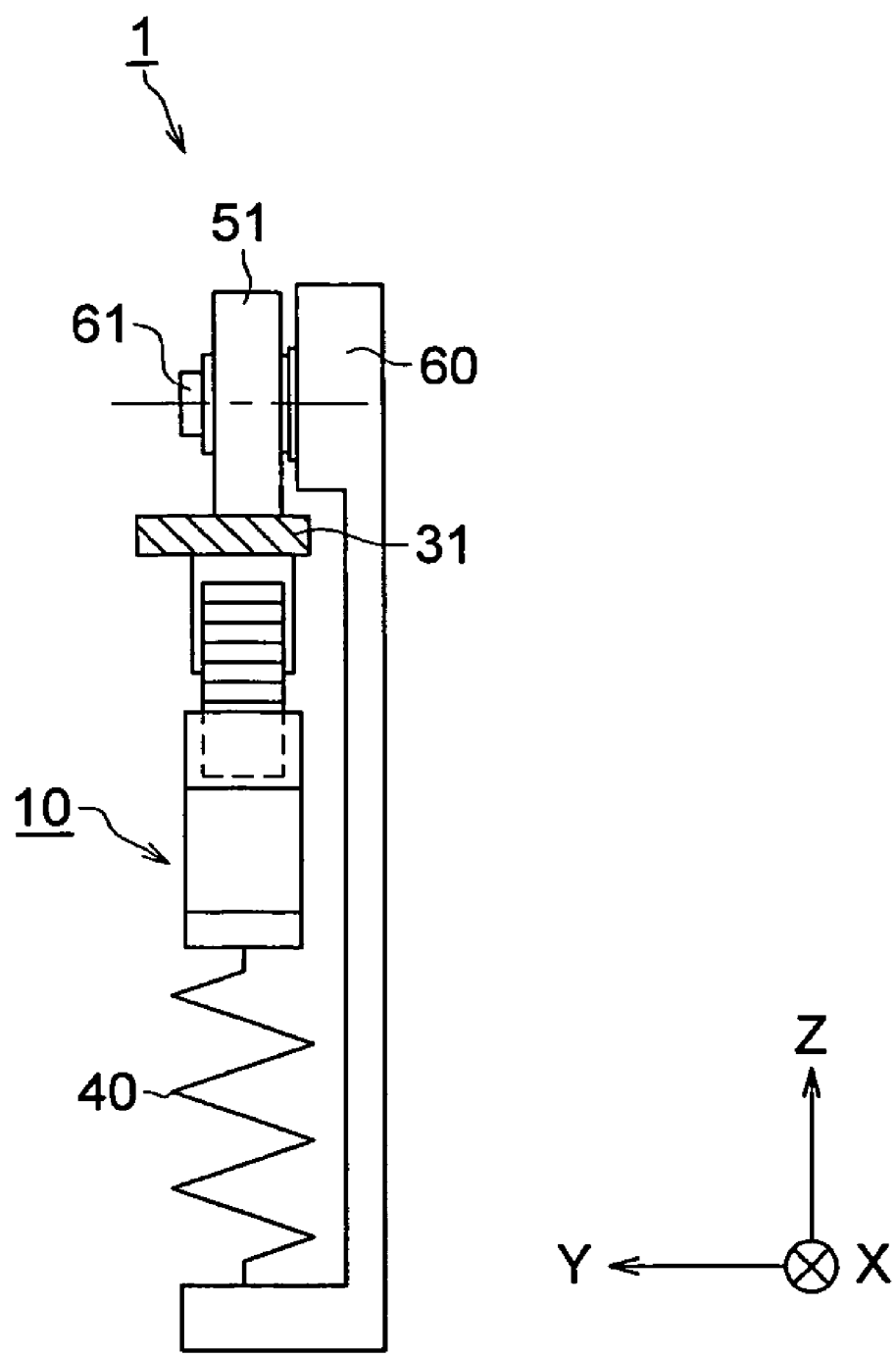
FIG. 2 is a side view of the vibration actuator used in the lens barrel relating to the present embodiment.

FIGS. 1 and 2 show vibration actuator 1 (being a driving device) used in the lens barrel relating to the present embodiments. FIG. 1 shows a front view of vibration actuator 1 used in the lens barrel relating to the embodiment. FIG. 2 shows a side view of vibration actuator 1 used in the lens barrel relating to the present embodiments. Additionally, the direction is shown by common orthogonal XYZ coordinates in each figure.

In FIGS. 1 and 2, vibration actuator 1 contains vibrating member 10, being a driving source, rail member 31 which receives vibration from vibrating member 10 and obtains driving force from vibrating member 10, pressure applying member 40 formed of an elastic member, supporting member 50 (being a load supporting member) to support the force (being a load) which is given to rail member 31 from vibrating member 10, and base plate 60.

Vibrating member 10, rail member 31 and supporting member 50 are arranged in that order in direction Z in FIG. 1.

Vibrating member 10 is structured of piezoelectric elements 11 and 12, chip member 13 and base 14, and vibrates based on applied high frequency voltage (high frequency signal).

Piezoelectric elements 11 and 12 are arranged so as to cross each other as shown in FIG. 1, and the crossed end is joined to chip member 13. The other ends of piezoelectric elements 11 and 12 are joined to base 14. Chip member 13 preferably has a stable and high friction coefficient, as well as being preferably structured of the non-abrasive materials (for example, a hard metal). Base 14 is preferably structured of a hard material which is easily produced (for example, stainless-steel). Piezoelectric elements 11 and 12 are adhered to chip member 13 and base 14 by an adhesive agent, preferably being an epoxy adhesive having high adhesive strength.

Piezoelectric elements 11 and 12 are a type of laminated elements, structured of thin plural ceramic plates and electrodes, both of which are alternately layered. Piezoelectric elements 11 and 12 are displacement elements which expand and contract perpendicular to the laminated surfaces based on the applied voltage. Specifically, they expand based on the applied predetermined polar voltage, and contract based on the applied opposite polar voltage. Due to this, based on the frequency of applied alternating current voltage, piezoelectric elements 11 and 12 repeatedly expand and contract. Accordingly, when the alternating current voltage including phase-contrast is applied onto piezoelectric elements 11 and 12, it is possible to vibrate vibrating member 10.

FIG. 3 shows the driving operation of vibrating member 10. Piezoelectric elements 11 and 12 of vibrating member 10 are activated by the alternating current voltage having the phase contrast, and thereby, chip member 13 of vibrating member 10 can be elliptically driven.

FIG. 3(a) shows the movement track of chip member 13 in a phase contrast at an angle of 60°, FIG. 3(b) shows that at 90°, and FIG. 3(c) shows that at 120°. As shown in FIG. 3(b), when the phase contrast is set to 90°, chip member 13 circulates. By changing the phase contrast, it is possible to set a desired movement track for chip member 13.

Vibrating member 10 allows rail member 31 to move by using the movement track of chip member 13, and if rail member 31 is fixed, it is possible to relatively drive base plate 60 which holds supporting member 50 and vibrating member 10.

Referring to FIGS. 1 and 2, rail member 31 comes into contact with chip member 13 of vibrating member 10, and the driving force from vibrating member 10 is directly transported to rail member 31. Specifically, due to the vibration of vibrating member 10, rail member 31 repeatedly touches (hits) and separates from chip member 13, and by the friction force between chip member 13 and rail member 31, base plate 60 which supports vibrating member 10 and supporting member 50, or rail member 31 relatively moves. In other words, by repeating short contact movement by the friction force between chip member 13 of vibrating member 10 and the surface of rail member 31, base plate 60 which supports vibrating member 10 and supporting member 50, or rail member 31 can be driven.

Rail member 31 is formed of metallic member or a ceramic. In order to prevent abrasion caused by contact with chip member 13, the metallic surface of rail member 31 is preferably coated with a hard covering. For example, for iron group material such as stainless steel, it is preferably treated with a thermal hardening process or nitriding process, and for aluminum, anodized aluminum film is preferable, or its metallic surface is preferably coated with ceramic as a durable abrasion coating. Further, by covering with alumina ceramic or zirconia ceramic, it is possible to attain weight saving, high rigidity, as well as minimal abrasion.

Pressure applying member 40 is assembled between vibrating member 10 and base plate 60, that is, pressure applying member 40 is under vibrating member 10 (in direction −Z). Pressure applying member 40 is structured of an elastic member, such as coiled spring, one end of which is fixed on base member 14 of vibrating member 10, while the other end is fixed on base plate 60. By urging force generated by pressure applying member 40, chip member 13 of vibrating member 10 is lightly pressed against rail member 31. In addition, the urging force of pressure applying member 40 is relatively small, and the expanding and contracting movement of pressure applying member 40 is adjusted so as not to follow the very high vibrating frequency of vibrating member 10. Due to this, chip member 13 repeatedly touches and separates from rail member 31, in opposition to the urging force of pressure applying member 40.

Further, supporting member 50 is arranged in such a manner that rail member 31 is sandwiched between supporting member 50 and chip member 13, that is, supporting member 50 is arranged on rail member 31 (in direction +Z). As shown in FIG. 1, supporting member 50 is structured of rotatable roller 51, secured by shaft 61. In addition, since roller 51 is secured by securing members which are not illustrated, roller 51 is prevented from slipping from shaft 61.

Roller 51 of supporting member 50 is arranged at the position immediately above chip member 13 of vibrating member 10, while rail member 31 is sandwiched between roller 51 and chip member 13. By such a structure, the force in direction Z, generated by vibrating means 10, is definitely supported so that a large driving force can be transferred to rail member 31.

Roller 51 is preferably formed of a material whose friction against rail member 31 is small. Specifically, among resin materials (for example, polyacetal), material having high sliding characteristics is preferable. For example, to improve the sliding characteristics, it is preferable to use the material to which an additive such as fluorine is compounded. In addition, the material which would not deformed by load is preferable for use. Besides, roller 51 can be formed of a metallic material.

The above descriptions are the outline of the vibration actuator to be used for the lens barrel of the present embodiments.

Figure 4:
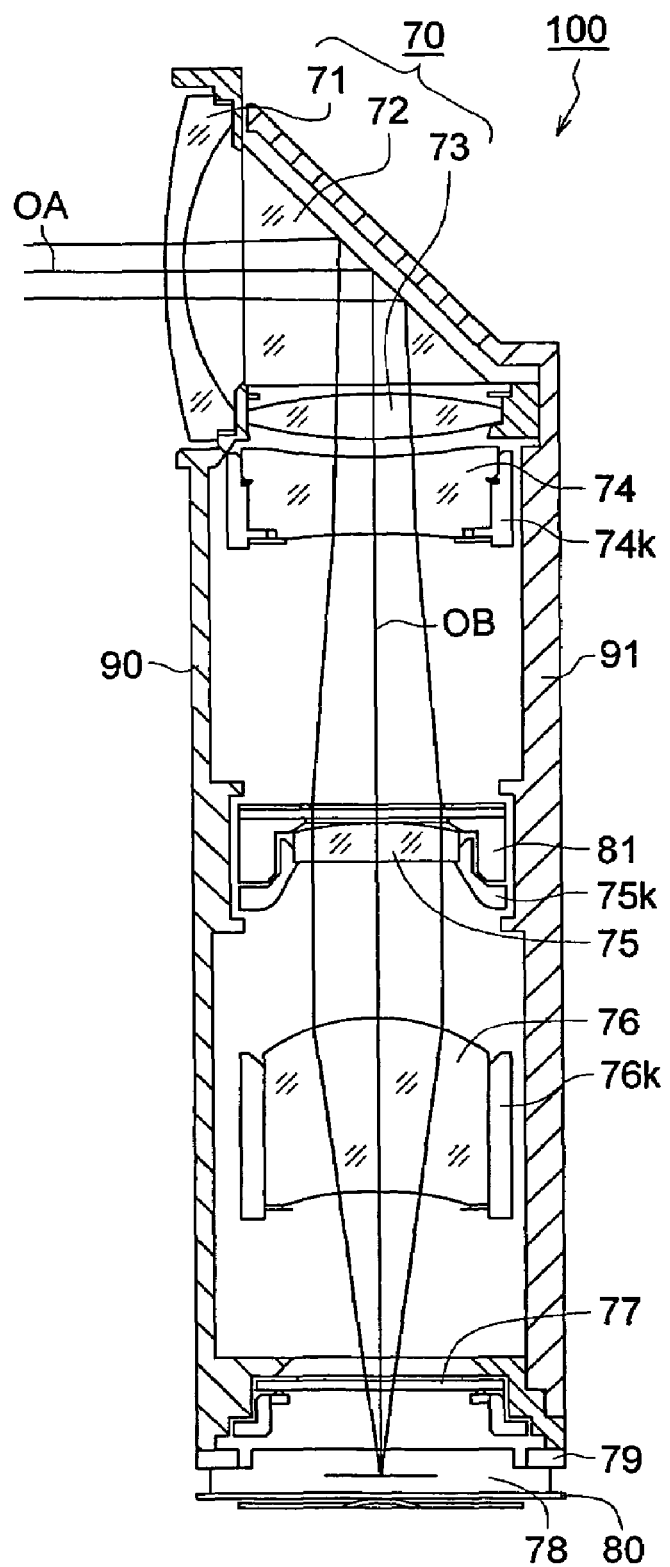
FIG. 4 is a cross-section of an example of the lens barrels relating to the present embodiment.

FIG. 4 is a sectional view showing an example of lens barrel 100 relating to the present embodiment. The lens units shown in FIG. 4 is a zoom lens structured in a bending optical system, showing the wide angle, and the lens barrel is sectioned by a surface including an optical axis before reflection and another optical axis after reflection. Additionally, in the present embodiment, the vibration actuator is used for moving the lens units structured in the above reflective optical system, however, the example is not limited to this, that is, the vibration actuator can also be used for moving the lens units structured in an optical system having a straight line optical axis.

Line OA is an optical axis before bending, while line OB is that after bending. Lens barrel 100 is covered with "main barrel A" 90 and "main barrel B" 91 as housing units.

First lens unit 70 is structured of lens 71 having optical axis OA and facing the subject, prism 72 to bend optical axis OA at nearly a right angle, and lens 73 arranged to have optical axis OB which corresponds to optical axis OA bent by prism 72. First lens unit 70 is secured onto "main barrel A" 90.

Second lens unit 74 is assembled in second lens unit frame 74*k*, and is integrally movable with second lens unit frame 74*k* to change magnification (hereinafter referred to as "zooming")

Third lens unit 75 is assembled in third lens unit frame 75*k*, and since third lens unit frame 75*k* is fixed onto "main barrel A" 90, third lens unit 75 does not move while zooming.

Fourth lens unit 76 is assembled in fourth lens unit frame 76*k*, being integrally movable with fourth lens unit frame 76*k* for focal adjustment (hereinafter referred to as "focusing") and zooming.

Optical filter 77, which is formed of an infra-red ray cut filter and an optical low pass filter, is assembled within "main barrel A" 90. Numeral 78 represents an image pickup element, and for which a CCD (charge coupled device) type image sensor, or a CMOS (complementary metal-oxide semiconductor) type image sensor is used. Image pickup element 78 is assembled on mount 79, and mount 79 and image pickup element 78 are assembled within "main barrel A" 90. Flexible printed circuit board 80, connected to image pickup element 78, is also connected to all other circuit boards of the camera. Shutter unit 81 is fixed onto "main barrel A" 90, in the same way as third lens unit frame 75*k*.

Second lens unit 74 and fourth lens unit 76 are moved from the wide angle position shown in FIG. 4 toward third lens unit 75 by set amounts to perform the zooming operation. Fourth lens unit 76 is further adjusted from the zoomed position to perform the focusing operation.

Figure 5:
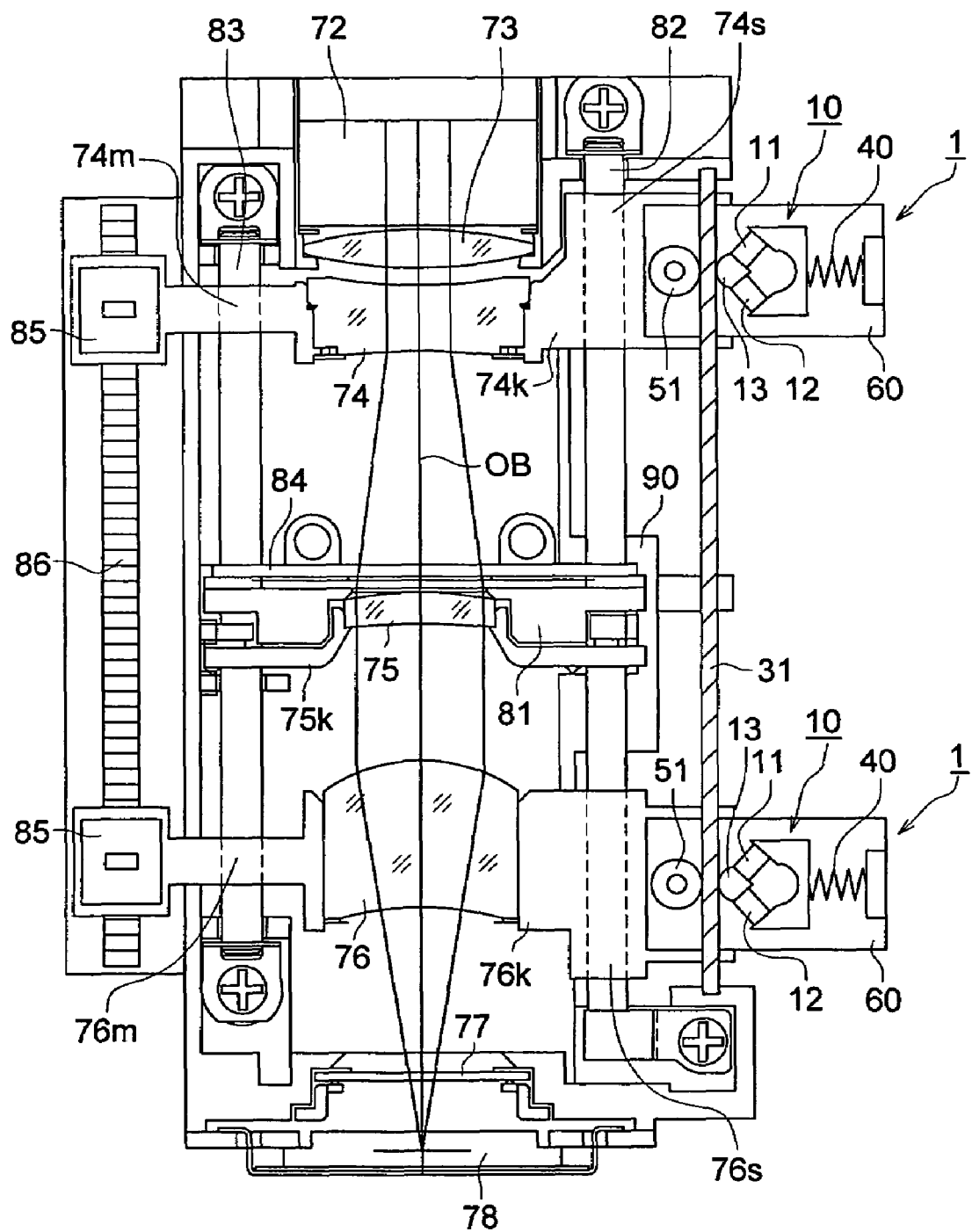
FIG. 5 is a cross-section of the driving mechanisms of the second lens unit and the fourth lens unit.

FIG. 5 illustratively shows a moving mechanism of second lens unit 74 and fourth lens unit 76. This figure shows the condition in which second lens unit 74 and fourth lens unit 76 are at the wide angle position. In the following figures, the same numbers are given to the members having the same functions to avoid the repetition of the explanation. In addition, to more easily understand the structure, FIG. 5 is illustrated in such a way that the position of the vibration actuator 1 is shifted to the outside of the lens barrel.

In FIG. 5, guide shaft 82 penetrates sleeve 74*s* integrally formed on second lens unit frame 74*k*, and also penetrates sleeve 76*s* integrally formed on fourth lens unit frame 76*k*. Further, guide shaft 83 penetrates anti-rotation device 74*m* integrally formed in second lens unit frame 74*k* and, also penetrates anti-rotation device 76*m* integrally formed in fourth lens unit frame 76*k*. By this structure, it is possible to guide second lens unit frame 74*k* and fourth lens unit frame 76*k* by guide shafts 82 and 83, and to move second lens unit frame 74*k* and fourth lens unit frame 76*k* in the direction of optical axis OB.

Further, guide shafts 82 and 83 engage and penetrate shutter unit 81 and third lens unit frame 75*k*. Each end of guide shafts 82 and 83 is fixed, and at the centers of guide shafts 82 and 83, guide shaft supporting member 84 is provided.

Yet further, rail member 31, structured in vibration actuators 1 is arranged in "main barrel A" 90, which functions as a housing section, and is fixed so as not to move in the longitudinal direction.

Each base plate 60, which supports vibrating member 10 and roller 51 is assembled onto second lens unit frame 74*k* and fourth lens unit frame 76*k*. As shown in FIG. 5, rail member 31 assembled onto "main barrel A" 90 is sandwiched between vibrating members 10 and rollers 51 which function as supporting members.

Yet further, piezoelectric elements 11 and 12 are electrically connected to the flexible printed circuit board, which are not illustrated in FIG. 5, so as to respectively receive alternate current voltage.

By the above described structure, piezoelectric elements 11 and 12 are activated by the alternate current voltage having phase difference, and chip members 13 of vibrating members 10 are allowed to move in an ellipsoid path. On the other hand, since rail member 31 is fixed to main "barrel A" 90, so as not to move in the longitudinal direction, second lens unit frame 74*k* and fourth lens unit frame 76*k*, each assembled to respective base plates 60 which support vibrating members 10 and rollers 51, are moved relatively, that is, second lens unit frame 74*k* and fourth lens unit frame 76*k* are guided by guide shafts 82 and 83 to move only in the direction of optical axis OB.

Yet further, to detect the position of second lens unit frame 74*k* and fourth lens unit frame 76*k*, thin magnetic film resistor elements 85, which serve as a position sensor, are integrally provided on each of lens unit frames 74*k* and 76*k*. At the position corresponding to the position of thin magnetic film resistor elements 85, sensor scale 86 featuring multiple magnetic poles N and S one after the other in the moving direction is fixed onto "main barrel A" 90. Though it is not illustrated, thin magnetic film resistor elements 85 are electrically connected to the flexible printed circuit board, whereby the outputted signals, produced by the shifted position of thin magnetic film resistor elements 85, are electrically detected, and the positions of first and second lens unit frames 74*k* and 76*k* can be determined.

Since sensor scale 86 is assembled so as to be commonly used for second lens unit frame 74*k* and fourth lens unit frame 76*k* as shown in FIG. 5, assembly time is reduced resulting in reduced production cost. Yet further, since the same position on sensor scale 86 can be used for detecting the positions of each different lens unit, in the case that plural lens units move in the same direction, the detecting sensors arranged for each lens unit can be placed closer than the interval between each lens unit, and thereby, the length of sensor scale 86 can be shortened.

By the above structure, vibrating member 10 for second lens unit frame 74k and vibrating member 10 for fourth lens unit frame 76k can be activated independently, and second and fourth lens unit frames 74k and 76k can be shifted to the targeted position for zooming, after which only fourth lens unit frame 76k is shifted for focusing.

Figure 6:
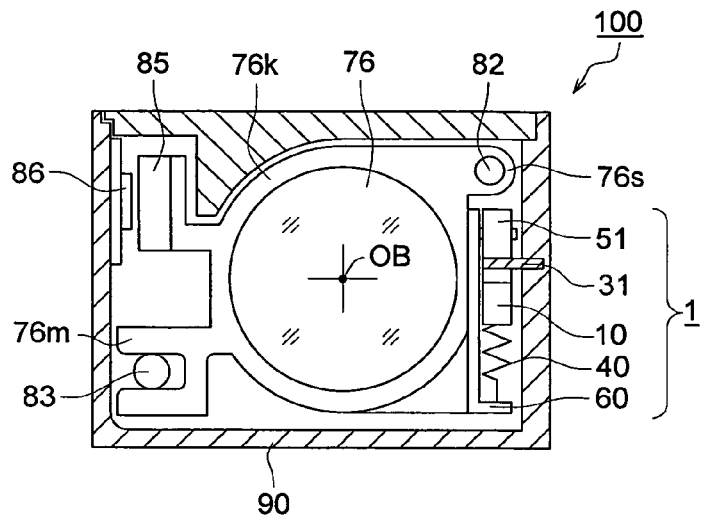
FIG. 6 is a cross-section of the lens barrel cut by a surface passing through the fourth lens unit, and perpendicular to the optical axis.

FIG. 6 is a cross-section of the lens barrel taken along a surface passing through fourth lens unit 76, and perpendicular to optical axis OB.

The cross-section of lens barrel 100 taken along the surface perpendicular to optical axis OB is approximately rectangular, and guide shaft 82 arranged in an opposing corner of the rectangle penetrates sleeve 76s, while guide shaft 83 penetrates anti-rotation device 76m.

In one of the other opposing corners of the rectangle, arranged are thin magnetic film resistor element 85 which serves as a position sensor and is integrally assembled in fourth lens unit frame 76k, and further, sensor scale 86 which is fixed on "main barrel A" 90 corresponding to thin magnetic film resistor elements 85 and has multiple magnetic poles N and S one after the other in parallel to optical axis OB.

Further, in the other opposing corner, vibration actuator 1 is provided. Rail member 31 structured as one member of vibration actuator 1 is fixed on "main barrel A" 90. Roller 51, serving as a supporting member, vibrating member 10 and pressure applying member 40 are integrally assembled on fourth lens unit frame 76k by base plate 60.

In addition, since second lens unit frame 74k, which supports second lens unit 74, has the same structure, the explanation is not repeated.

As explained above, vibration actuator 1, which is positioned flatways, can be arranged in various orientations, compared to the case of a columnar stepping motor being employed, and thereby the cross section area of lens barrel 100 can be reduced. Yet further, since vibration actuator 1 can be arranged in a space surrounded by "main barrel A" 90 and "main barrel B" 91, both being the housing sections, dust is prevented from entering lens barrel 100. Yet further, undesired noise is greatly reduced so that lens barrel 100 can be preferably used for the camera which records sound while taking moving pictures.

Since the actuator for moving the lens units is structured of vibrating member 10 which is arranged so as to allow the plural piezoelectric elements to cross each other at a predetermined angle, rail member 31 arranged facing vibrating member 10, and roller 51, being a rotatable supporting member, which is arranged facing vibrating member 10, which sandwiches rail member 31 with roller 51, and further, since rail member 31 is fixed onto the main barrel which functions as the housing section, and vibrating member 10 and roller 51 are positioned at the moving lens unit, it is possible for roller 51 to receive the reaction force of the pressure onto rail member 31 generated by vibrating member 10, and the reaction force exerted perpendicular in the moving direction, can be prevented from pushing the lens frames and the guide shafts. Due to this, the change of the undesired friction force between the lens frames and the guide shafts is overcome, and the lens barrel is stably driven at high efficiency, whereby high durability can be obtained.

Yet further, while vibration actuator 1 of the present embodiment is not activated, rail member 31 is sandwiched between vibrating member 10 and roller 51, whereby the positions of the lens frames are secured during no electrical flow, that is, it is possible to secure the lens units with no electrical flow, which reduces electrical energy.

Concerning the initial positions as the basing points of second lens unit frame 74k and fourth lens unit frame 76k, stop points can be employed at which the position detecting sensors do not show any change while the vibration actuators are activated to move the lens units in the predetermined directions. As another method, masking plates can be employed, which are formed on second lens unit frame 74k and fourth lens unit frame 76k, and the initial positions as the basing points are determined by the masking plates and the photo-interrupters. It is also possible for photo-reflectors and the photo-interrupters to be used for the detection of the initial positions.

Yet further, concerning the detection of the moved distance of second lens unit frame 74k and fourth lens unit frame 76k, it is not necessary to limit the thin magnetic film resistor elements and the scale sensor to be formed of magnetic material. For example, it is possible to employ scale sensors, being the photo-interrupters, which are assembled onto second lens unit frame 74k and fourth lens unit frame 76k, and the scale sensors in which light passing sections and light shielded sections are formed one after the other. Yet further, it is also possible to employ scale sensors, being the photo-reflectors, which are assembled onto second lens unit frame 74k and fourth lens unit frame 76k, and the scale sensors formed of light reflecting sections and non-reflect sections alternatively. In each case, it is possible to employ a single common sensor scale for second lens unit frame 74k and fourth lens unit frame 76k.

Figure 7:
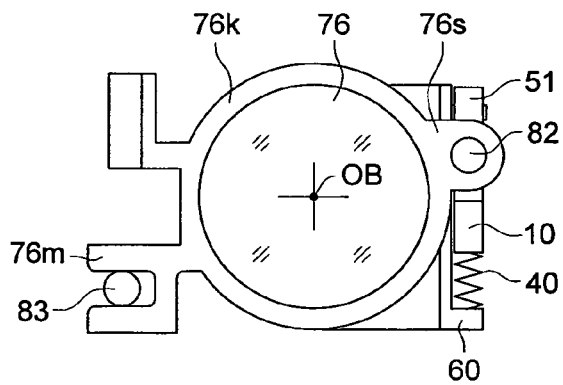
FIGS. 7(a) and (b) show another example of the configuration of the guide members and the rail member.
Figure 7:
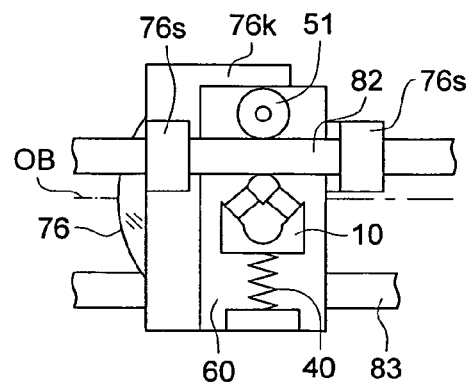

FIG. 7 shows another example of the configuration of the guide members and the rail member, in which one of the guide members is combined with the rail member, but only fourth lens unit frame 76k is specifically shown as an example. FIG. 7(a) is a drawing of fourth lens unit frame 76k viewed from the direction of optical axis OB, while FIG. 7(b) is a side view of fourth lens unit frame 76k.

In FIG. 7(a), guide shaft 82 is movably mounted in sleeve 76s of fourth lens unit frame 76k, while guide shaft 83 is movably mounted in anti-rotation device 76m. In addition, base plate 60, which supports vibrating member 10, roller 51 and pressure applying member 40, is assembled onto fourth lens unit frame 76k.

As shown in FIG. 7(b), vibrating member 10 and roller 51 functioning as a supporting member, are positioned to sandwich guide shaft 82 which is fixed onto the main barrel adjacent to sleeve 76s. That is, guide shaft 82, being a guide member of fourth lens unit frame 76k, acts for a rail member which is part of the structure of the vibration actuator.

Figure 8:
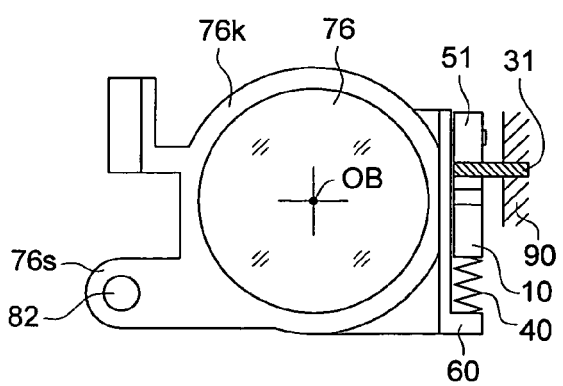
FIGS. 8(a) and (b) show yet another example of the configuration of the guide members and the rail member.
Figure 8:
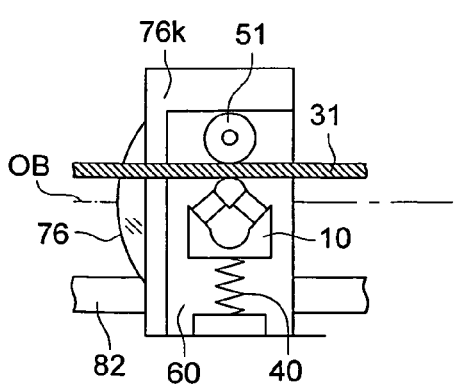

FIG. 8 shows yet another example of the configuration of the guide members and the rail member, showing an example in which one of the guide members is combined with the rail member. FIG. 8(a) is a drawing of fourth lens unit frame 76k viewed from the direction of optical axis OB, while FIG. 8(b) is a side view of fourth lens unit frame 76k.

As shown in FIG. 8(a), in fourth lens unit frame 76k, guide shaft 82 is movably mounted in sleeve 76s, and base plate 60 is assembled to support vibrating member 10, roller 51 and pressure applying member 40. Rail member 31 is fixed onto "main barrel A" 90 serving as a housing section. As shown in FIG. 8(b), vibrating member 10, and roller 51 serving as a supporting member are arranged while sandwiching rail member 31 fixed onto "main barrel A" 90. That is, the guide member for rocking the rotation of fourth lens unit frame 76k is combined with the rail member structured in the vibration actuator.

As shown in FIGS. 7 and 8, since one of the plural guide members arranged in the moving direction combines with the rail member structured in the vibration actuator, the manpower for assembly and the number of parts are reduced, and further, the lens barrel can be downsized.

Yet further, in the structure shown in FIGS. 6 and 8, "main barrel A" 90 functions as a member to control the vibration of rail member 31.

In addition, in the above embodiments, the two lens units structured in the zooming optical system are driven for zooming and focusing. However, it is possible to use the embodiment of the optical system with the other structures, and further, the present embodiments can also be used for the focusing operation of a single focal optical system, which do not depart from the scope of the present invention.

Further, in the above embodiments, the two lens units structured in the zooming optical system are respectively driven by the two vibration actuators having the same structure. However, even if any one of the two lens units is driven by a different-type driving device, such the structure does not depart from the scope of the present invention.

While the preferred embodiments of the present invention have been described using specific term, such description is for illustrative purpose only, and it is to be understood that changes and variations may be made without departing from the spirit and scope of the appended claims.

What is claimed is:

1. A lens barrel, comprising:
    plural lens units having a common optical axis for zooming and focusing a subject;
    a rail member being parallel to the common optical axis of the plural lens units;
    a vibrating section for moving the plural lens units along the rail member, comprising:
        plural piezoelectric elements as vibrating members which are assembled to cross each other at a predetermined angle and are activated by applied high frequency electrical signals,
        a chip member which is adhered to the plural piezoelectric elements, and comes into contact with the rail member, and
        a rotatable supporting member for sandwiching the rail member with the chip member so as to move the lens units along the rail member; and
    a housing section for housing the plural lens units, the rail member and the vibrating section.

2. The lens barrel of claim 1, further comprising plural guide members to guide the plural lens units,
    wherein one of the plural guide members acts for the rail member.

3. The lens barrel in claim 1, further comprising:
    a position detecting unit for detecting positions of the lens units while the lens units are moving, the position detecting unit comprising:
        a sensor section, and
        a sensor scale section,
        wherein the sensor section is assembled on the lens units which are movable, while the sensor scale section is assembled on the housing section.

4. The lens barrel in claim 1,
    wherein the lens units belong to the zoom optical system for moving the plural lens units, and the sensor scale section is commonly used for detecting positions of the plural lens units which move.

5. The lens barrel in claim 1,
    wherein the vibrating member is assembled in the housing section.

6. The lens barrel of claim 1, further composing:
    a guide shaft which is mounted in parallel to the rail member to guide the plural lens units when the vibrating section moves the lens units along the rail member.

* * * * *